United States Patent [19]

Miles et al.

[11] Patent Number: 5,840,622
[45] Date of Patent: Nov. 24, 1998

[54] PHASE MASK LASER FABRICATION OF FINE PATTERN ELECTRONIC INTERCONNECT STRUCTURES

[75] Inventors: Robert S. Miles, Monrovia; Philip A. Trask, Laguna Hills; Vincent A. Pillai, Irvine, all of Calif.

[73] Assignee: Raytheon Company, Lexington, Mass.

[21] Appl. No.: 703,854

[22] Filed: Aug. 27, 1996

Related U.S. Application Data

[62] Division of Ser. No. 436,045, May 5, 1995, abandoned, which is a continuation of Ser. No. 119,925, Sep. 10, 1993, abandoned.

[51] Int. Cl.$^6$ .................................................. H01L 21/28
[52] U.S. Cl. ...................... 438/622; 438/623; 438/662; 438/795; 438/949
[58] Field of Search ...................................... 437/173, 195, 437/180, 228, 229; 156/656.1, 659.1; 438/622, 623, 662, 780, 795, 948, 949

[56] References Cited

U.S. PATENT DOCUMENTS

| | | |
|---|---|---|
| 4,081,654 | 3/1978 | Mracek . |
| 4,478,677 | 10/1984 | Chen et al. . |
| 4,490,210 | 12/1984 | Chen et al. . |
| 4,490,211 | 12/1984 | Chen et al. . |
| 4,508,749 | 4/1985 | Brannon et al. . |
| 4,684,437 | 8/1987 | Donelon et al. . |
| 4,877,644 | 10/1989 | Wu et al. . |
| 4,904,498 | 2/1990 | Wu . |
| 5,094,536 | 3/1992 | MacDonald et al. . |

(List continued on next page.)

OTHER PUBLICATIONS

A. H. Smith, "Phase Mask Machining for High Throughput Via Formation", ICEMM Proceedings '93, pp. 208–213, from Denver Conference, Apr. 16, 1993.

Primary Examiner—John Niebling
Assistant Examiner—Thomas G. Bilodeau
Attorney, Agent, or Firm—Leonard A. Alkov; Glenn H. Lenzen, Jr.

[57] ABSTRACT

Phase mask laser machining procedures for fabricating high density fine pattern feature electrical interconnection structures. Conductor patterns are fabricated using a phase mask laser patterned dielectric layer as a conductor wet etch masking layer, or by subtractively removing metal using holographic phase mask laser micromachining. In accordance with the present invention, a substrate is provided, a first layer of dielectric material is formed on the substrate, a metal layer is formed on the first layer of dielectric material, and a second layer of dielectric material is then formed on the metal layer. A phase mask is disposed above the second layer of dielectric material that has a predefined phase pattern therein defining a metal conductor pattern that corresponds to an interconnect structure. The second layer of dielectric material is then processed using the phase mask to form the interconnect structure. In a first procedure, the second layer of dielectric material is irradiated through the phase mask using laser energy to remove portions of the second layer of dielectric material and expose the metal layer to define the metal conductor pattern and to provide a dielectric etch mask. Then, the exposed metal layer is wet etched using the dielectric etch mask to form the interconnect structure. A second procedure provides for irradiating the second layer of dielectric material with laser energy through the phase mask to remove portions of the second layer of dielectric material to define a metal conductor pattern. Then, a second metal layer is electrolessly plated, or chemical vapor deposited, in the metal conductor pattern on the exposed surface of the second layer of dielectric material to form the interconnect structure. In a third procedure, the first layer of dielectric material is formed on the substrate, the metal layer is formed thereon, and the phase mask is disposed above the metal layer. The conductor pattern is then directly etched in the metal layer using a laser and the phase mask.

7 Claims, 3 Drawing Sheets

U.S. PATENT DOCUMENTS

| | | |
|---|---|---|
| 5,136,413 | 8/1992 | MacDonald et al. . |
| 5,142,132 | 8/1992 | MacDonald et al. . |
| 5,196,376 | 3/1993 | Reche . |
| 5,202,748 | 4/1993 | MacDonald et al. . |
| 5,236,551 | 8/1993 | Pan . |
| 5,328,785 | 7/1994 | Smith et al. . |
| 5,362,940 | 11/1994 | MacDonald et al. . |
| 5,364,493 | 11/1994 | Hunter, Jr. et al. . |
| 5,392,119 | 2/1995 | McArthur et al. . |
| 5,482,801 | 1/1996 | Smith et al. . |

PHASE MASK LASER FABRICATION OF FINE PATTERN ELECTRONIC INTERCONNECT STRUCTURES

This application is a division of Ser. No. 08/436,045, filed May 5,1995, which is a continuation of Ser. No. 08/119,925, filed Sep. 10,1993 now abandoned.

BACKGROUND

The present invention relates generally to electronic interconnect structure fabrication processes, and more particularly, to processes for fabricating fine pattern feature electronic interconnect structures, micro-electro-mechanical devices, multichip module substrates and semiconductor devices that employ phase mask laser fabrication techniques.

Prior art relating to the fabrication of fine pattern interconnection structures principally involves use of automatic semiconductor equipment and photolithography to expose patterns in a photoresist. Patterns are then either wet etched or dry etched in a plasma, or reactive ion etched, sequentially, to create vias and conductors. A currently used process employed at the assignee of the present invention makes use of reactive ion etching procedure described in U.S. Pat. No. 5,034,091 entitled "Method of Forming an Electrical Via Structure". The process disclosed in this patent includes such steps as metal sputtering, coating the wafer with resist, mask alignment, metal pattern exposure, resist development, pre-etch inspection, wet etching of the metal, post-etch inspection, resist stripping, and final inspection. All told, there are over 150 individual process steps that are required to complete the metal patterning of a wafer.

Via holes may also be formed by partially curing an organic dielectric (polyimide), coating with photoresist, then developing both the resist and the dielectric in a basic solution. Photosensitive dielectric materials can be directly imaged by UV radiation in a semiconductor aligner, without the use of photoresist, and then patterns are formed by developing in a solvent solution. While the dry reactive ion etching (RIE) process for via formation and the wet etch process for conductor formation are effective, they are relatively slow due to the number of processing steps, and have additional disadvantages including requirements for expensive capital equipment and the use of reactive hazardous chemicals.

Consequently, it is an objective of the present invention to provide for processes for fabricating electronic interconnect structures that employ phase mask laser fabrication techniques that improves upon the above-mentioned conventional processes.

SUMMARY OF THE INVENTION

The present invention provides for the use of phase mask laser machining to fabricate high density fine pattern feature electrical interconnection structures in semiconductor devices, such as semiconductor wafers and multichip modules, and micro-electromechanical devices, multichip module substrates, and semiconductor devices, and the like. The novelty of the present invention is the use of phase mask laser machining procedures to delineate metal conductor patterns. The present invention improves upon and extends the concept of phase mask laser machining of via holes in organic dielectric layers to include the fabrication of dielectric patterns, and conductor patterns in addition to the via holes. The conductor patterns are fabricated using a phase mask laser patterned dielectric layer as a conductor wet etch masking layer, or by subtractively removing metal using holographic phase mask laser micromachining.

More particularly, the present invention comprises processes for fabricating interconnect structures for a device. The interconnect structure may be part of a semiconductor device, a micro-electro-mechanical device, a multichip module substrate, or a semiconductor device, or the like. The present processes may be used to fabricate fine pattern interconnect structures for top level wafer interconnections on semiconductor devices, multichip interconnect structures for microchip modules including MCM-D (deposition-type), MCM-C (ceramic-type), or MCM-L (laminated-type) multichip modules, and micro-electro-mechanical devices, for example.

The present process comprises the following steps. First, a substrate is provided. It is to be understood that the term substrate as used herein is a base layer, which may include metal, silicon, polyimide materials, such as are used in semiconductor and multichip module processing, or flexible substrate materials that are used in flexible wiring interconnect structures, for example. A first layer of dielectric material is formed on the substrate or base layer. A metal layer is formed on the first layer of dielectric material. A second layer of dielectric material is formed on the metal layer. A phase mask is disposed above the second layer of dielectric material that has a predefined phase pattern therein defining a metal conductor pattern that corresponds to an interconnect structure. The second layer of dielectric material is then processed using the phase mask to form the interconnect structure of the device.

In a first procedure, the second layer of dielectric material is irradiated through the phase mask using laser energy to remove portions of the second layer of dielectric material and expose the metal layer to define the metal conductor pattern of the device and to provide a dielectric etch mask. Then, the exposed metal layer is wet etched using the dielectric etch mask to form the interconnect structure of the device. The etch mask formed by the second layer of dielectric material need not be removed after etching of the metal, and may be made thin enough to not disturb the overall thickness relationship of the interlayer dielectric layer (an additional deposited dielectric layer), whereby the capacitance of the interlayer dielectric is maintained at its desired value.

A second procedure provides for irradiating the second layer of dielectric material with laser energy through the phase mask to remove portions of the second layer of dielectric material to define a metal conductor pattern of the device. Then, a second metal layer is electrolessly plated, or chemical vapor deposited, in the metal conductor pattern on the exposed surface of the second layer of dielectric material to form the interconnect structure of the device.

In a third procedure, the first layer of dielectric material is formed on the substrate, and the metal layer is formed on the first layer of dielectric material. Then the phase mask is disposed above the metal layer. The conductor pattern defining the electrical interconnection structure is then directly etched in the metal layer using a laser and the phase mask.

The use of phase mask laser micromachining for patterning conductors greatly reduces the cost of and cycle time for the fabrication of high density fine pattern electrical interconnect structures. The combination of phase mask laser micromachining of via holes and conductor patterns results in a reduction of process complexity and cycle time approaching 75% and a corresponding reduction in material cost of 30%. More specifically, the present invention improves upon the procedure described in U.S. Pat. No. 5,034,091 cited above by eliminating about 100 individual process steps from that procedure that are required to complete the metal patterning of a wafer. Capacity increases by a factor of 2.4 over a currently used process with equivalent units of production capital equipment. The present processes also eliminates the use of caustic materials and environmentally sensitive chemicals in producing many devices, and greatly reduces or eliminates the need for using and disposal of toxic materials.

The present invention employs phase mask laser micromachining to delineate conductor patterns during the fabrication of various devices and structures identified above and replaces the conventional use of photolithography for that purpose, which includes photoresist, printing, developing, wet chemical stripping, and the use of reactive ion etching (RIE) to form tapered vias in polyimide films. The present invention greatly simplifies fabrication of high density interconnection structures by eliminating numerous iterative resist and etch steps used in the current photolithographic process. The present invention also eliminates the need for, and costs of, expensive photoresist, developer, resist stripper and caustic etch materials in interconnect structure fabrication. The phase mask laser machining processes of the present invention enables tailoring of the slope of the edges of dielectric and metal patterns to provide for sloped via profiles to insure high reliability due to good metal step coverage on the via sidewalls. The phase mask laser machining processes of the present invention also produces vertical edges for metal interconnects, when required, to insure good electrical performance and precise control of resistance and impedance values.

An alterative procedure in accordance with the present invention uses an excimer laser to etch the desired metal patterns directly in the organic polymer such that via holes and a next level metal pattern are patterned simultaneously. The laser forms a channel having the desired shape of the conductor in a polymer surface that forms an etched conductor pattern and attached via. The laser activates the polymer surface such that it is suitable for electroless plating of metal, or chemical vapor deposition. Conductors are thus formed and contact to a previous metal layer is made simultaneously by plating metal in the laser-etched pattern.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
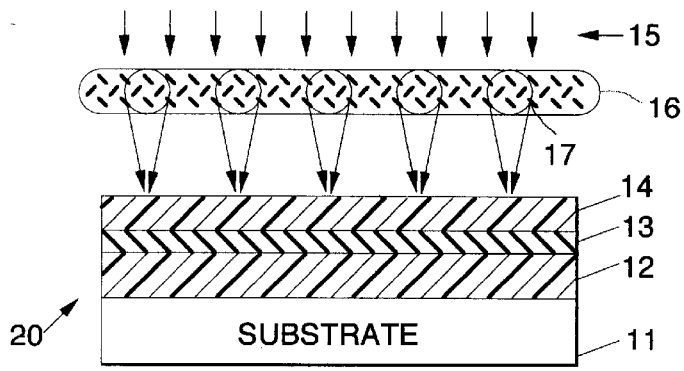
FIGS. 1 and 2 show schematic representations of steps in a conventional phase mask laser micromachining processing procedure for forming via holes.
Figure 2:
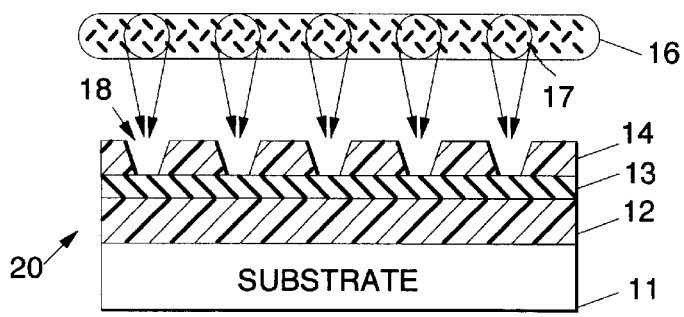

Referring to the drawing figures, FIGS. 1 and 2 show schematic representations of steps in a conventional phase mask laser micromachining processing procedure for forming via holes. The conventional laser phase mask micromachining processing procedure 10 comprises the following steps. Referring to FIG. 1, a semiconductor wafer 20 comprising a substrate 11 such as alumina ($Al_2O_3$) or silicon is provided. A polymer layer 12, such as a polyimide layer 12, having a thickness of about ten microns, is formed over the substrate 11 and then a metal layer 13, such as aluminum, for example, having a thickness of about five microns, is formed over the polyimide layer 12. Then, a second polymer layer 14, such as a polyimide layer 14 having a thickness of about 10 microns is formed over the aluminum layer 13. A holographic phase mask 16 is then disposed above the second polyimide layer 14, and a low intensity excimer laser 15 is used to irradiate the exposed surface of the second polyimide layer 14 through the holographic phase mask 16. Phase patterns 17 in the holographic phase mask 16 cause focusing of the energy from the excimer laser 15 which forms vias 18 therein, as is shown in FIG. 2.

Figure 3:
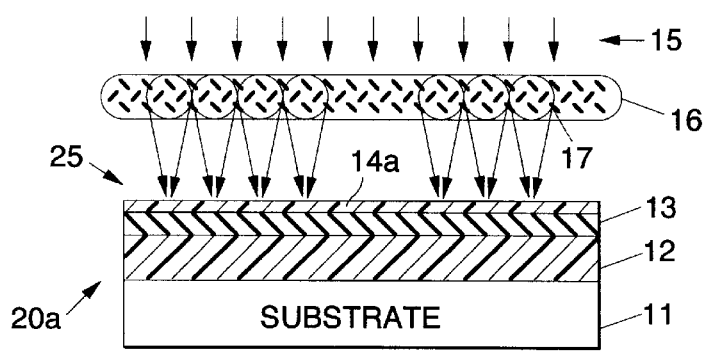
FIGS. 3–5 show schematic representations of steps in a holographic phase mask laser micromachining processing procedure in accordance with the principles of the present invention that provides for fabrication of interconnect structures.
Figure 4:
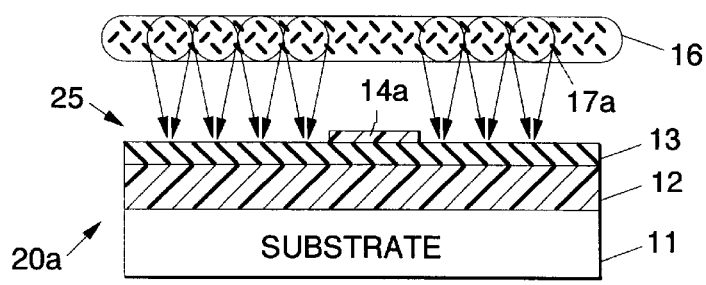
Figure 5:
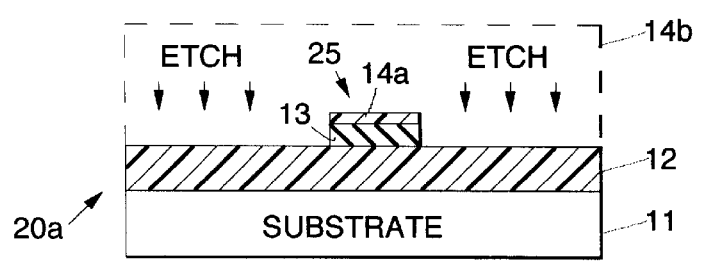

FIGS. 3–5 show schematic representations of steps in a laser holographic phase mask micromachining processing procedure 10a in accordance with the principles of the present invention that provides for fabrication of interconnect structures 25 for a device 20a. It is to be understood that the interconnect structure 25 may be part of a semiconductor device, a micro-electro-mechanical device, a multichip module substrate, or a semiconductor device, or the like. In addition, the present processes may be used to fabricate fine pattern interconnect structures for top level wafer interconnections on semiconductor devices, multichip interconnect structures for microchip modules including MCM-D (deposition-type), MCM-C (ceramic-type), or MCM-L (laminated-type) multichip modules, and micro-electromechanical devices, for example. The structure of the device 20a illustrated in FIGS. 3–5 is presented for the purposes of illustration, and it is to be understood that the structure may vary for different devices.

The steps in the present process 10a are similar to those described above with reference to the conventional via hole fabrication procedure 10. However, in the processing procedure 10a, a second relatively thin polyimide layer 14a, having a thickness of about 1–2 microns, is disposed over the aluminum layer 13 in the areas where the interconnect structures 25 are to be formed. The low intensity excimer laser 15 is used to irradiate the exposed surface of the second relatively thin polyimide layer 14a through the holographic phase mask 16. Suitable holographic phase masks 16 are available from Litel Instruments, Inc. of San Diego, Calif. Phase patterns 17a in the holographic phase mask 16 cause focusing of the excimer laser 15 in order to remove portions of the second relatively thin polyimide layer 14a. The aluminum layer 13 disposed below the removed portions of the second relatively thin polyimide layer 14a is then removed by a wet etching process, for example, and the remaining portion of the aluminum layer 13 provides for an interconnect metal structure 25 for the integrated circuit. An additional polyimide layer 14b (shown in dashed lines), having a thickness of about 10 microns, is then disposed over the exposed surfaces of the polyimide layers 12, 14a and the aluminum layer 13 and processing for the device 20a is continued to completion. The second relatively thin polyimide layer 14a becomes integrated with the additional polyimide layer 14b. Consequently, the etch mask formed by the second relatively thin polyimide layer 14a need not be removed after etching of the aluminum layer 13, and may be made thin enough to not disturb the overall thickness relationship of the interlayer dielectric layer (the additional polyimide layer 14b), whereby the capacitance of the interlayer dielectric is maintained at a desired value.

Figure 6:
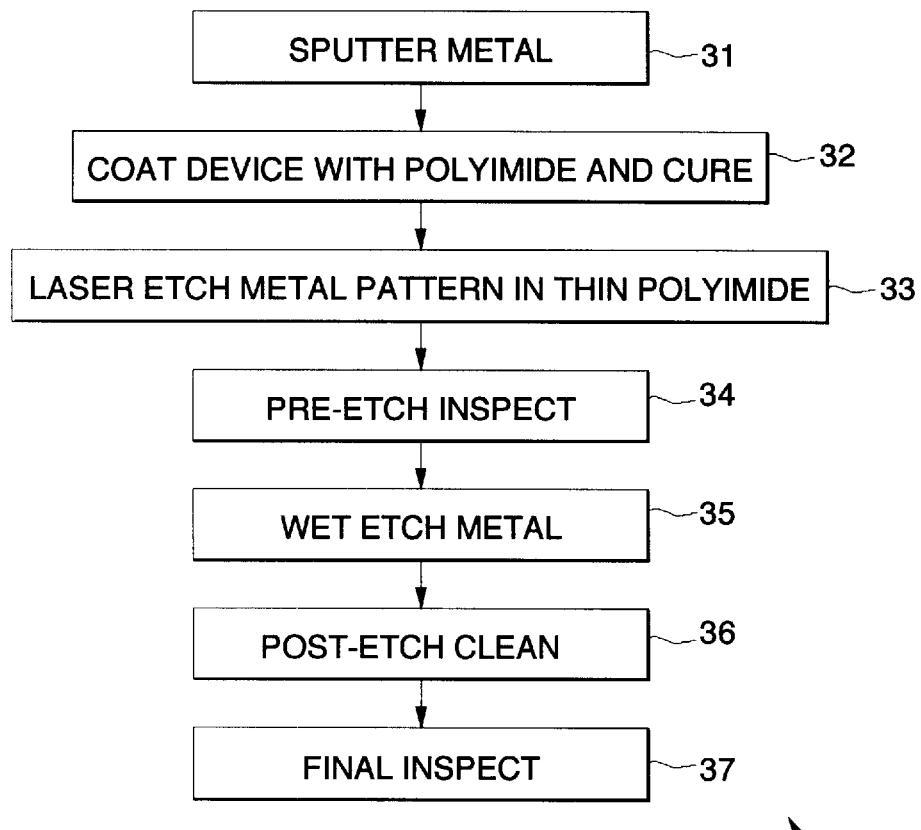
FIG. 6 shows a process flow diagram illustrating the steps in fabricating interconnect structures using the holographic phase laser mask micromachining processing procedure of the present invention.

FIG. 6 shows a process flow diagram illustrating a processing procedure 30 for fabricating interconnect structures 25 using holographic phase mask laser micromachining in accordance with the present invention. This processing procedure 30 employs a dielectric etch mask as will be described below. A device 20a comprising a substrate 11 is processed to deposit a layer of organic polymer, comprising the polyimide layer 12, thereon, and the metal layer 13 is sputtered, for example, onto the surface of the polyimide layer 12 in step 31. Then, the wafer is coated with the second relatively thin polyimide layer 14a and cured in step 32. A holographic phase mask 16 is prepared that is adapted to allow an excimer laser 15 to selectively remove portions of the second polyimide layer 14a (organic polymer layer) that are disposed over areas of the metal layer 13 that are to be subsequently etched away.

Then, the desired metal pattern is etched in the thin polyimide layer 14a by exposing it through the holographic phase mask 16 using the excimer laser 15 in step 33. As a result, the second polyimide layer 14a is patterned, removing portions of the organic polymer except those that are disposed over areas that are to become metal conductors. The wafer is then inspected prior to wet etching in step 34. The remaining unetched portions of the second polyimide layer 14a serve as an etch mask to replicate the conductor pattern. The metal layer 13 is wet etched, using a subtractive wet etch process, in step 35, which produces the desired conductor pattern. The wafer is then cleaned in step 36 subsequent to the metal etching step 35, and is finally inspected in step 37.

The organic mask layer formed by the second polyimide layer 14a may be left on the etched metal conductors, or removed if desired. If the thin polyimide layer 14a (masking polyimide layer) comprises the same material that is to be used as the interlayer dielectric material that is subsequently disposed over the metal layer 13, then the thin polyimide layer 14a may be left in place and subsequently overcoated with the next dielectric layer (such as the polyimide layer 14b). If an alternative organic masking layer, such as photoresist, for example is used instead of the thin polyimide layer 14a, it is typically removed prior to deposition of the subsequent dielectric layer. This illustrates a major cost advantage provided by the present invention, in that no photoresist is required, and consequently, no steps are required to deposit or remove the photoresist.

Figure 7:
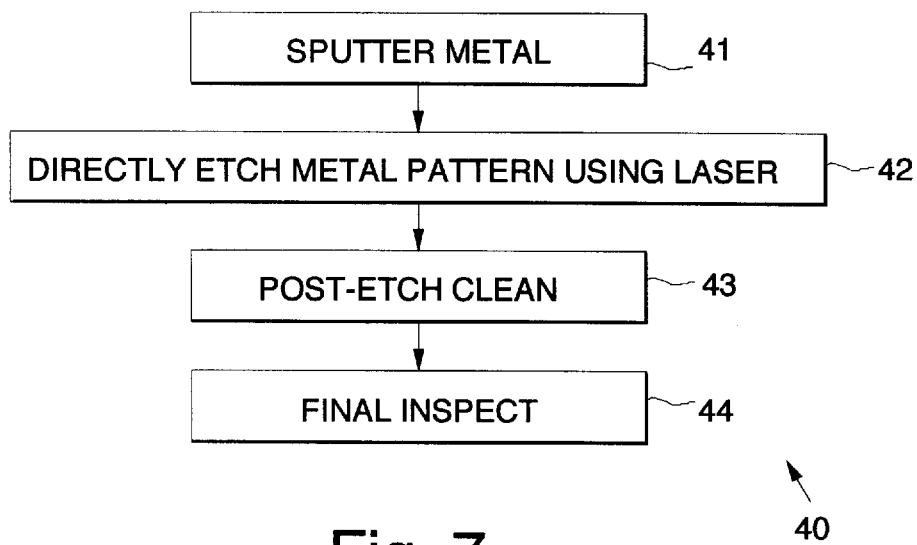
FIG. 7 shows a process flow diagram illustrating direct etching of interconnect structures using holographic phase mask laser micromachining in accordance with the principles of the present invention.

FIG. 7 shows a process flow diagram illustrating a direct etching procedure 40 for etching interconnect structures 25 (direct metal patterning) using holographic phase mask laser micromachining in accordance with the principles of the present invention. A wafer 20 comprising a substrate 11 is processed to deposit a layer of organic polymer, comprising the polyimide layer 12, thereon, and the metal layer 13 is sputtered, for example, onto the surface of the polyimide layer 12 in step 41. The metal pattern is then directly etched using the holographic phase mask 16 in step 42. Then the wafer is cleaned in step 43. The wafer is then inspected in step 44.

By precisely controlling the energy output from the laser 15, and by providing proper selectivity, such as is achieved by using multiple passes of the laser 15 with differing energy levels to quickly ablate the bulk of the metal layer 13 and then slowly clean off the last remaining portion of the metal layer 13 with little or no damage to the polyimide layer 12, the metal layer 13 is directly patterned using the holographic phase mask 16, whereby metal is removed with the laser 15, resulting in the desired conductor pattern. Several passes at very low energy density are generally required to ablate the metal conductor patterns without removing the underlying polyimide layer 12 (organic polymer layer). This is a somewhat slower procedure than the above-described procedure 30 that employs the dielectric etch mask.

Figure 8:
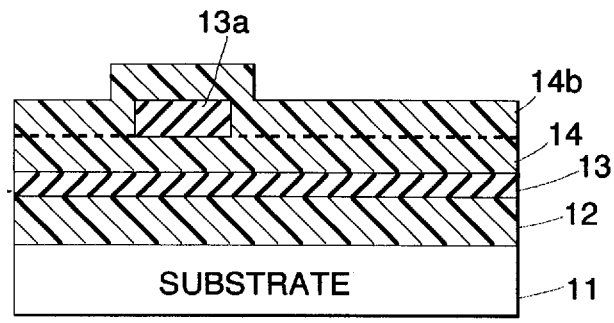
FIGS. 8–11 show schematic representations of steps in a processing procedure for patterning interconnect structures that permits electroless plating or chemical vapor deposition of conductors in accordance with the principles of the present invention.
Figure 9:
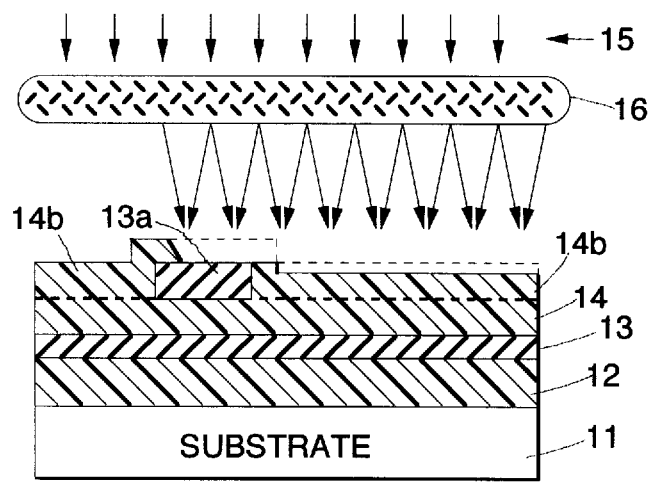
Figure 10:
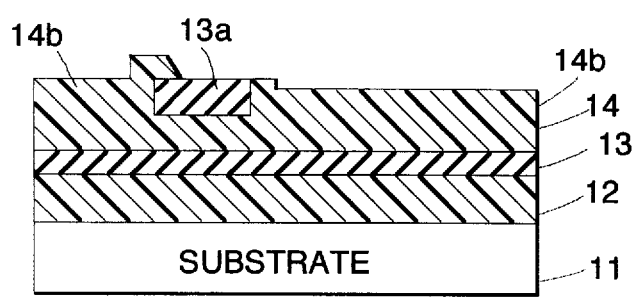
Figure 11:
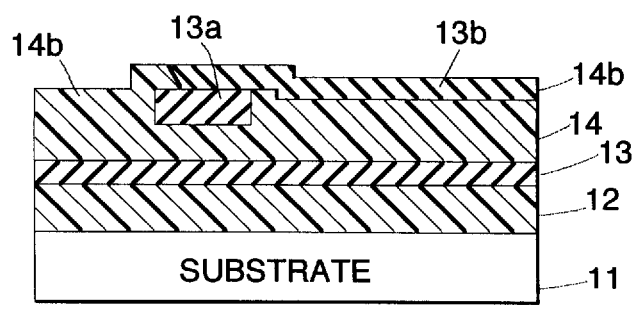

FIGS. 8–11 show schematic representations of steps in another processing procedure 50 for fabricating conductor patterns to permit electroless plating, or chemical vapor deposition, of conductors in accordance with the principles of the present invention. FIG. 8 shows an organic polymer or polyimide layer 14 (formed on a substrate 11, and onto which a metal conductor 13a is formed. A second polyimide layer 14b is formed over the exposed surface of the polyimide layer 14 and metal conductor layer 13a. Then, as shown in FIG. 9, the exposed surface of the second polyimide layer 14b is etched using the excimer laser 15 and holographic phase mask 16, to remove portions of the second polyimide layer 14b shown in dashed lines. This produces the wafer structure shown in FIG. 10. Then, as shown in FIG. 11, a second conductor layer 13b, such as aluminum or copper, for example, is electrolessly plated, or chemical vapor deposited, for example, into the etched pattern in the second polyimide layer 14b to provide for connection to the metal conductor layer 13a. The procedure of FIGS. 8–11 uses the laser 15 and phase mask 16 to ablate patterns in the organic polymer layer 14 that have the desired shape of the metal interconnect patterns, and then uses electroless plating, or chemical vapor deposition, to fill the etched patterns with metal. The laser energy preconditions the polymer layer 14b, allowing electroless plating or chemical vapor deposition to occur.

Initial test wafers have been patterned using the phase mask laser procedures of the present invention. The test wafers comprised alumina wafers with a ten micron thick polyimide layer 12, five microns thick aluminum layer 13, and a second polyimide layer 14a having a thickness of ten microns. Four mil diameter vias 18 were patterned in the second polyimide layer 14a without disturbing the underlying aluminum layer 13, with good via shape to insure proper step coverage. This testing proves out the usefulness of the present invention, in that a thin organic layer 14a may be patterned on top of a metal layer 13, without disturbing the metal layer 13, which serves as a stencil for subsequent wet etching of the metal layer 13, as is achieved in the procedure 30 illustrated in FIG. 6.

The present invention eliminates the need for photolithographic materials and hazardous RIE etching gases, and the equipment required for these conventional processes. Only a phase mask laser system is needed to pattern the via holes and conductor patterns. The conductor patterns may be wet etched using the patterned dielectric as an etch mask. Via holes are directly formed by the phase mask laser system in the dielectric.

Thus there has been described new and improved processes for fabricating interconnect structures in semiconductor devices that employ phase mask laser fabrication techniques. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A process for fabricating an interconnect structure comprising the steps of:

provinding a substrate;

forming a first layer of dielectric material on the substrate wherein the first layer of dielectric material has a first thickness;

forming a metal layer on the first layer of dielectric material;

forming a second layer of dielectric material on the metal layer wherein the second layer of dielectric material has a second thickness that is less than about one-fifth of the first thickness of the first layer of dielectric material;

disposing a phase mask above the second layer of dielectric material that has a phase pattern therein defining a metal conductor pattern that corresponds to an interconnect structure;

providing a laser beam;

processing the second layer of dielectric material using the phase mask and the laser beam to form the interconnect structure wherein a portion of the second layer of dielectric material remains on top of the interconnect structure.

2. The process of claim 1 wherein the step of processing the second layer of dielectric material comprises the steps of:

irradiating the second layer of dielectric material through the phase mask using laser energy to remove portions of the second layer of dielectric material and expose the metal layer to define the metal conductor pattern and to provide a dielectric etch mask; and wet etching the exposed metal layer using the dielectric etch mask to form the interconnect structure.

3. The process of claim 1 wherein the step of processing the second layer of dielectric material comprises the step of:

irradiating the second layer of dielectric material with laser energy using the phase mask to remove portions of the second layer of dielectric material to define a metal conductor pattern; and electrolessly plating a second metal layer in the metal conductor pattern on the exposed surface of the second layer of dielectric material to form the interconnect structure.

4. The process of claim 1 wherein the step of processing the second layer of dielectric material comprises the step of:

irradiating the second layer of dielectric material with laser energy using the phase mask to remove portions of the second layer of dielectric material to define a metal conductor pattern; and chemical vapor depositing a second metal layer in the metal conductor pattern on the exposed surface of the second layer of dielectric material to form the interconnect structure.

5. The process of claim 1 wherein the first layer of dielectric material comprises an organic polymer.

6. The process of claim 5 wherein the organic polymer comprises polyimide.

7. The process of claim 1 wherein the laser comprises an excimer laser.

* * * * *